United States Patent [19]

Danilenko et al.

[11] Patent Number: 4,930,106

[45] Date of Patent: May 29, 1990

[54] DUAL CACHE RAM FOR RAPID INVALIDATION

[75] Inventors: Michael Danilenko, West St. Paul; Clarence W. Dekarske, St. Paul Park; John E. Larson, Eagan, all of Minn.

[73] Assignee: Unisys Corporation, Blue Bell, Pa.

[21] Appl. No.: 237,817

[22] Filed: Aug. 29, 1988

[51] Int. Cl.[5] ............................................. G11C 15/00
[52] U.S. Cl. .................................. 365/189.01; 365/49; 364/200
[58] Field of Search ............................ 365/49, 189.01; 364/200

[56] References Cited

U.S. PATENT DOCUMENTS 3,845,474 10/1974 Lange et al. ............................ 365/49
4,825,412 4/1989 Sager et al. ............................ 365/49

Primary Examiner—Joseph A. Popek
Attorney, Agent, or Firm—Glenn W. Bowen; Robert S. Bramson

[57] ABSTRACT

A cache buffer for a multiprocessor system utilizes two RAMs to store validity bits. Use of these RAMs greatly reduces chip area required to implement the validity buffer and reduces interconnection foil (printed connectors) and hence propagation time. An initial clear state is written into all of the memory locations of both RAMs. One of the RAMs then becomes the active validity bit RAM and the other a standby. When a fast invalidate command is received, upon an invalidate parity error indication from a memory readout, for example, the standby RAM is switched to the active RAM, and the validity bits of the formerly active RAM are cleared in sequential write cycles after it is switched to a standby state.

2 Claims, 6 Drawing Sheets

DUAL CACHE RAM FOR RAPID INVALIDATION

BACKGROUND OF THE INVENTION

1. Field of the Invention

This invention relates to cache memories for multiprocessing systems in which validating bits in the cache for any processor are set and cleared in order to verify that data stored in each cache memory matches data stored in a common main memory. In particular, the invention requires at least two RAM chips for each cache, one of which stores the validating bits associated with the cache until such time that a processor sends an invalidate instruction to an active RAM. Following the invalidate instruction, a previously cleared, or inactive, RAM is switched in to replace the RAM which is to be invalidated (i.e., cleared).

2. Background Art

In multiprocessor systems each of the processors generally has an associated low capacity, low cycle time cache memory and a main memory which is shared by all of the processors. A problem arises in such a system when a main memory address may be resident in one or more processors' dedicated cache memories at any one instant of time and another processor (or other device capable of storing into main memory) stores information into that main memory address in the main memory. If one of the plural processors modifies that data word with a write operation, steps must be taken in order to preserve the integrity of the data to prevent a processor from obtaining a data word from its own dedicated cache which is no longer current because of the write operation performed by a different processor.

Duplicate or ambiguous results must be avoided when data is copied into a requestor's cache memory if that data word has been modified in the shared main memory by a different requestor. Other processors in the system must be prevented from utilizing invalid data words which may be resident in their dedicated cache memories. This may be accomplished through the addition of a write monitoring apparatus which is associated with each dedicated cache memory in the system. The write monitoring apparatus monitors traffic on the system's main memory buses and when it detects a match in address with a data word contained in its associated dedicated cache memory, it clears, (or sets), a bit in a "valid flag directory" which causes the processor associated with that cache memory, when attempting to read that data word from that dedicated cache, to recognize the data word as being invalid. The processor will retrieve the desired data word from the main memory where it has been modified, instead of obtaining the word directly from its associated cache memory.

By this technique, each processor dedicated cache will only indicate resident data as "valid" if that data had been previously placed in the data cache and had not yet been modified in main memory by another requestor's actions. Therefore, cache contents are current, in real time, within the normal timing uncertainties and granularities of a shared main memory, multiprocessor, computer system. To ensure that totally unambiguous validity semaphore actions, e.g., Test and Set, are properly performed, the replace cycle involves (1) a read direct from main memory, bypassing the cache memory, (2) modification including the setting or clearing of the semaphore part of the operand word, and (3) writing of the updated words utilizing the main memory. The write portion of the replace cycle is monitored by other dedicated cache memories in a normal write cycle which, therefore, ensures that the other dedicated cache memories are informed of the semaphore up-date.

The sequence of events resulting in the address invalidation of a data word in a given requestor's (Requestor A) cache because of another requestor's (Requestor B) write operation into main memory at that same address is as follows:

First, let it be assumed that Requestor A has requested and used a data word at address, y, in main memory, leaving the data word in Requestor A's cache and the address, y, in both its associated Primary and Duplicate Cache Directories. Then, as Requestor B initiates a memory sequence (write) to modify the data word in main memory at address, y, it supplies the address, y, on the memory bus as it activates its "memory initiate" and "write" control lines. The monitor of Requestor A monitors all of the ports into main memory (except its own) and so when it determines that Requestor B has activated a memory "write" operation, the address associated with that "write" operation is captured by being latched into a register and compared with the addresses currently resident in Requestor A's Cache Directory.

Under the assumed conditions, a compare will be found and a conflict search "hit" is made. The resulting hit signal is used to clear the "valid" flag associated with that directory location containing the address, y. Both a true address compare and the "valid flag set" condition are required for a resident data hit condition when a requestor references its cache memory for a data word. In the above case, when Requestor A references its cache memory for the data word at address, y, it will find the address compare upon a search of its cache directory, but will be forced to fetch the data word from the main memory because the "valid flag" will now not be set. In this way, Requestor A will now not be set. In this way, Requestor A will receive the current, unambiguous data from the system's main memory.

SUMMARY OF THE INVENTION

Normally Buffer (Cache) Validity Bits are implemented in Register File chips with a clear line. A fast Buffer invalidation (for example, in response to a signal from a processor when an error has occurred) generates a pulse on the clear line, thereby clearing all Validity bits. The present design uses two RAM chips instead to do the fast Buffer invalidation thereby saving critical chip area and reducing interconnection requirements and propagation delay. Upon the appearance of a Master Clear a special clearing mechanism clears both RAM chips. A pointer then indicates which RAM chip is used first. Later when fast invalidation is indicated, the switch from the first to second RAM chip is made. While the second RAM chip is being used, the first RAM chip is being cleared.

DETAILED DESCRIPTION OF THE PREFERRED EMBODIMENT

Figure 1:
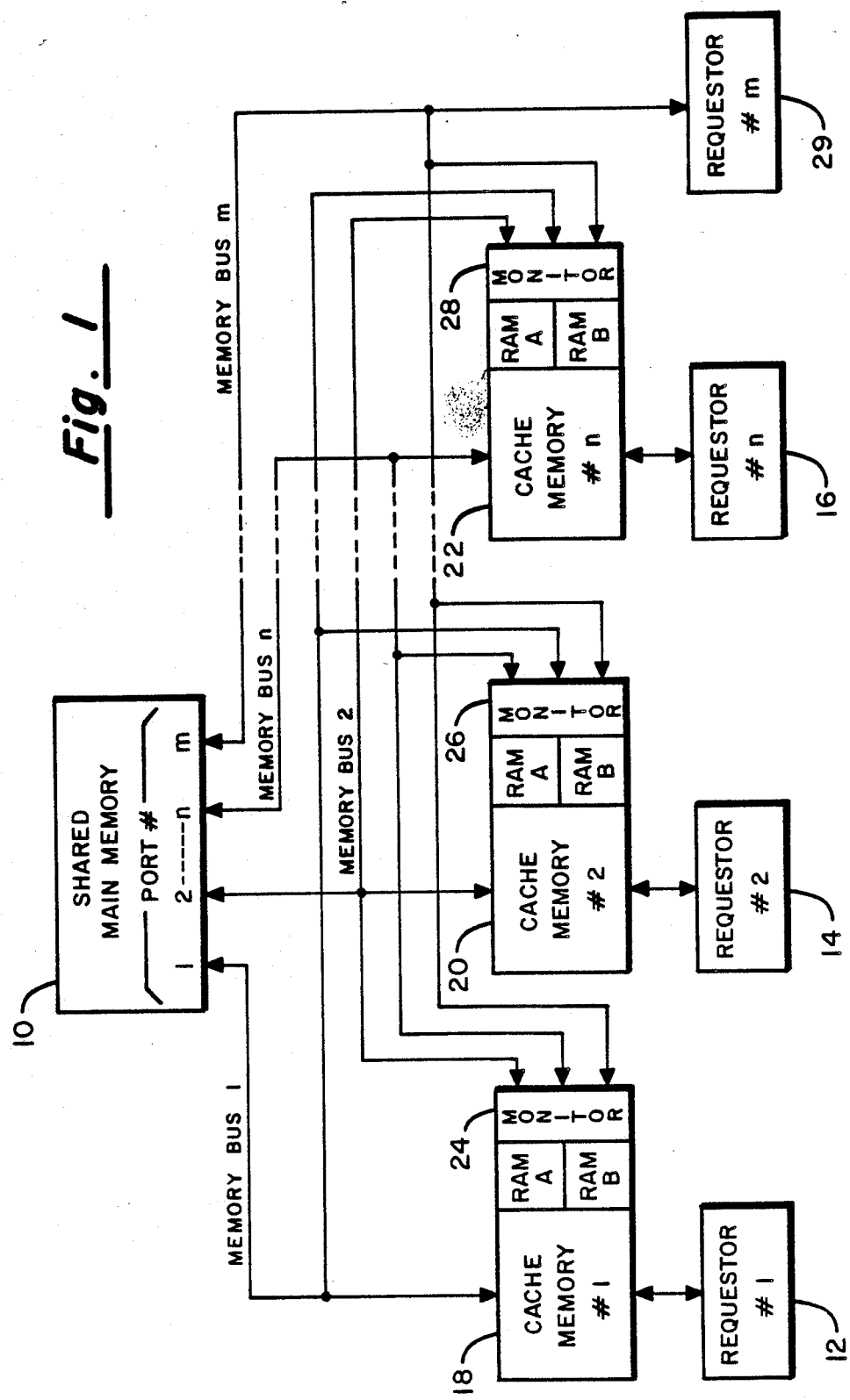
FIG. 1 is a general block diagram illustrating a multi-requestor data processing system having dedicated cache memories and a shared main memory.

With reference to FIG. 1, there is shown a main memory module 10 which comprises words of storage organized into an array of rows and columns of block groupings. It should be understood, however, that the memory indicated is exemplary only, and the present invention is in no way limited to a memory of a particular size or configuration. It should also be understood that this main memory may not necessarily be a single unit or bank, but, instead, may be a plurality of such units, and each may also contain a memory hierarchy within each unit. The memory 10 is provided with a plurality of ports (1 ... m) to which may be connected a plurality of Requestor units 12, 14, 16.

The term "requestor" is used to generically encompass a range of digital data processing devices capable of supplying or receiving data words (operands and instructions) to or from the main memory 10. Typically, a Requestor may be a data processor, an input/output device, etc. Shown coupled to each Requestor is an associated cache memory module 18, 20, 22. However, in some system applications, a requestor, such as Requestor 29, may not have a cache memory associated with it. Associated with each of the cache memory modules 18, 20 and 22 are monitor networks 24, 26 and 28.

The monitor network 24 associated with the cache memory module 18 is coupled to the main memory port 1 is connected by cables to all of the main memory ports, except port 1. Similarly, the monitor network 26 associated with the cache memory module 20 connected to all main memory ports, except port 2. Likewise, monitor network 28 associated with cache memory module n is coupled by cables to all of the main memory ports 1, 2, etc., except memory port n. Thus, each of the monitor networks 24, 26 and 28 is able to monitor memory address signals and write control signals being presented to the main memory 10 by all of the Requestors 12, 14 and 16, except those from its own Requestors.

Figure 2:
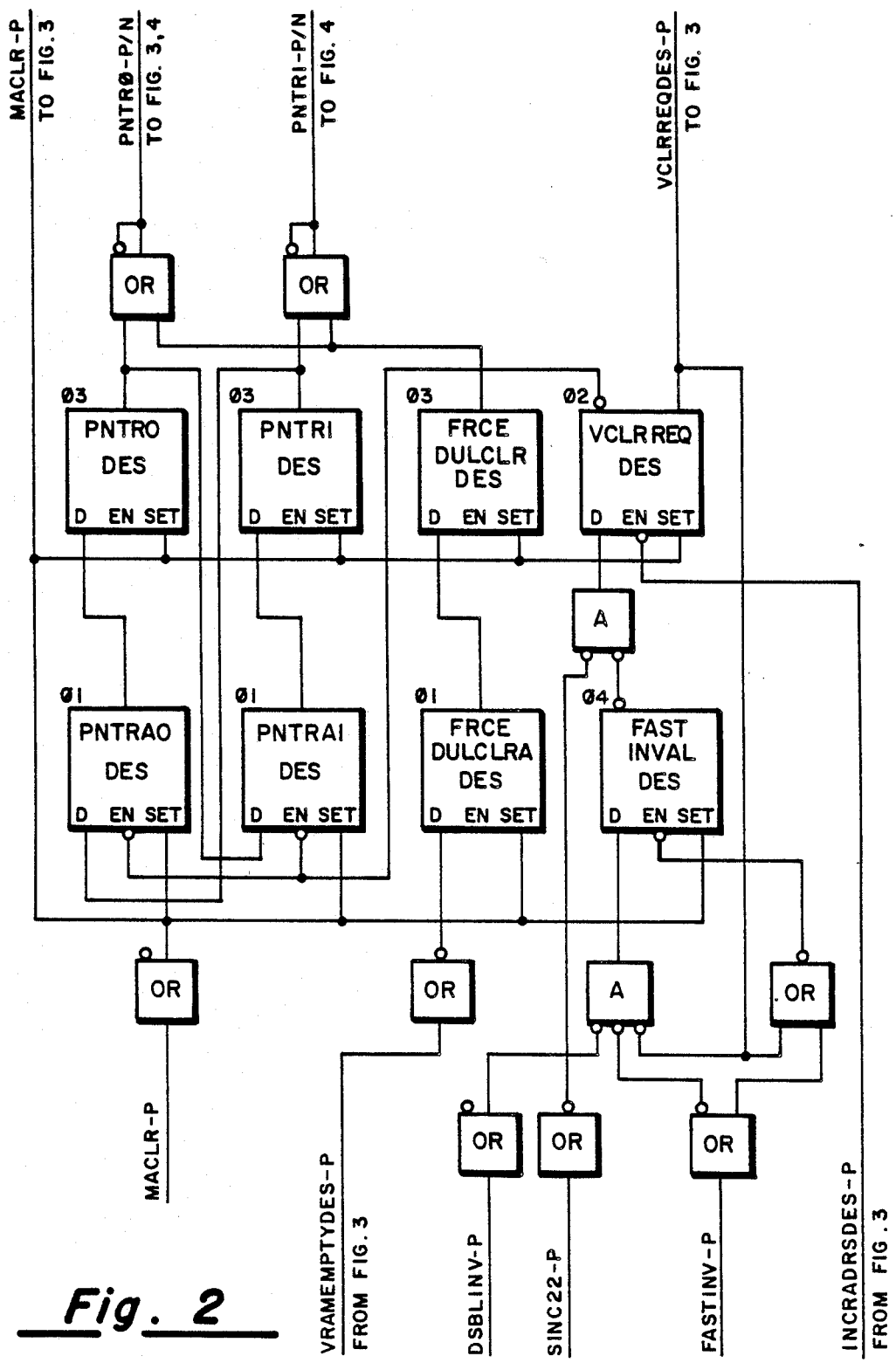
FIGS. 2-4 are block diagrams illustrating the implementation of one embodiment of the present invention. In these drawings a circle on an input or an output line indicates a logical inversion of the binary signal level, as is conventional in logic diagrams.
Figure 3:
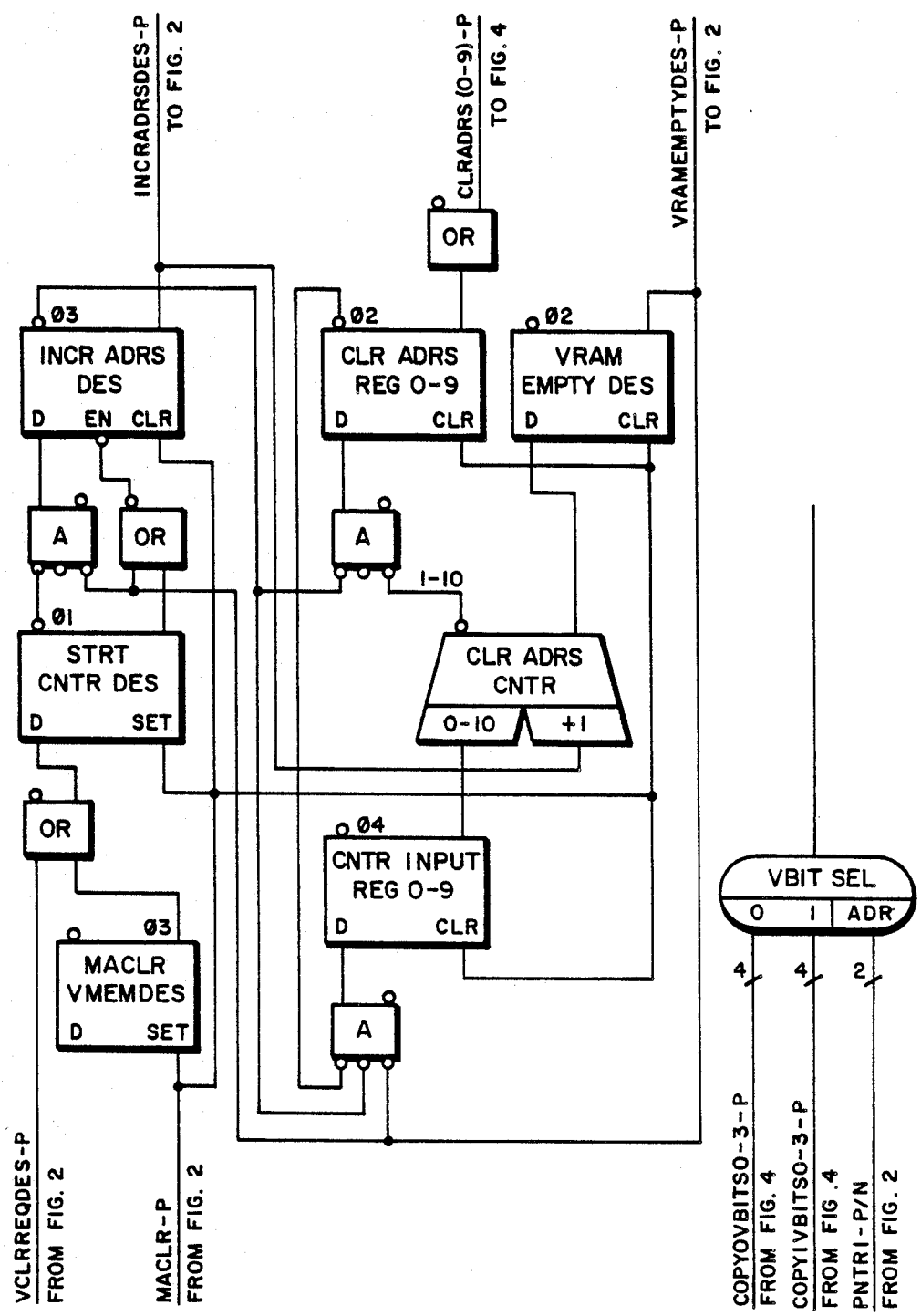
Figure 4:
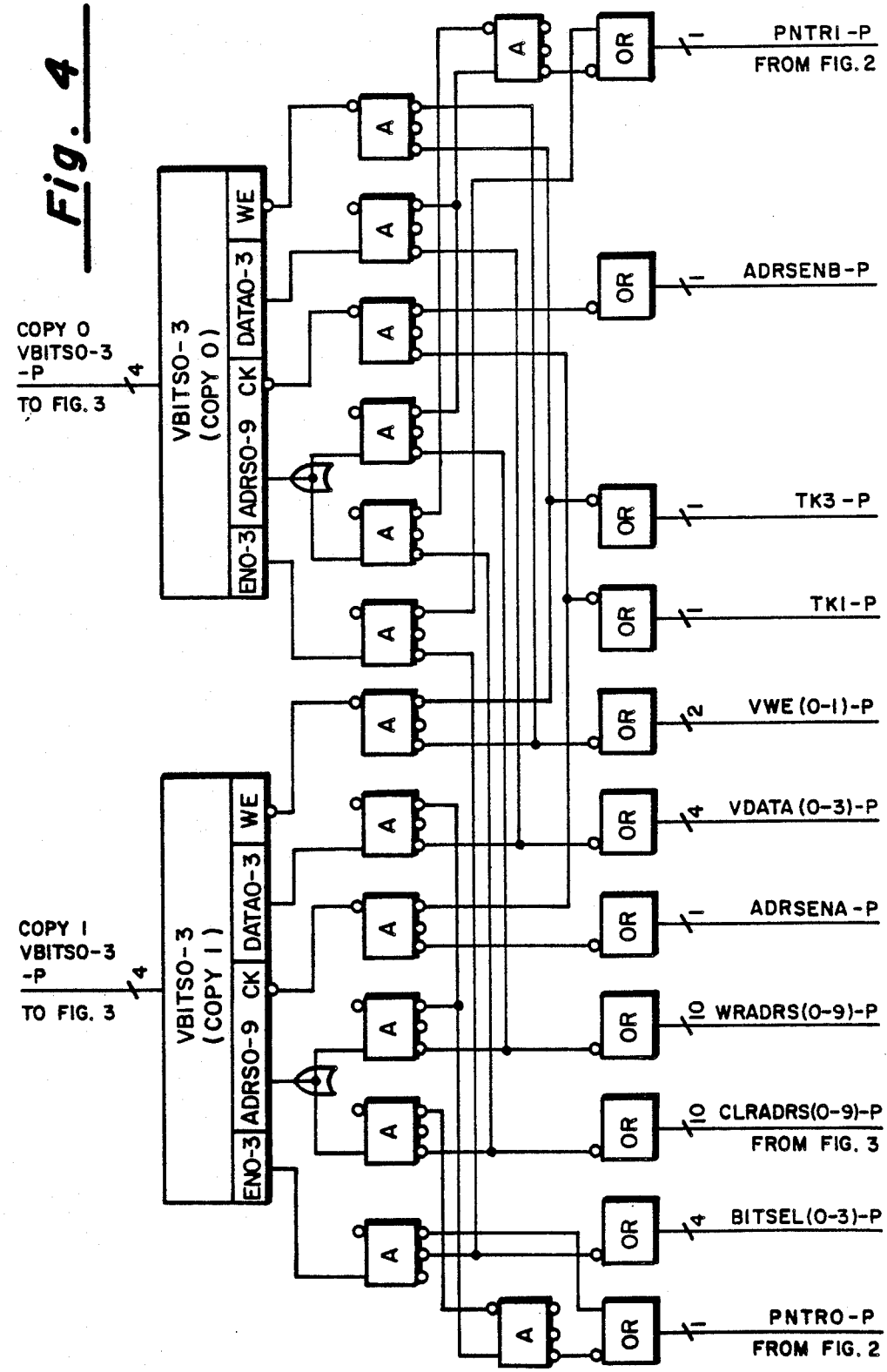
Figure 5:
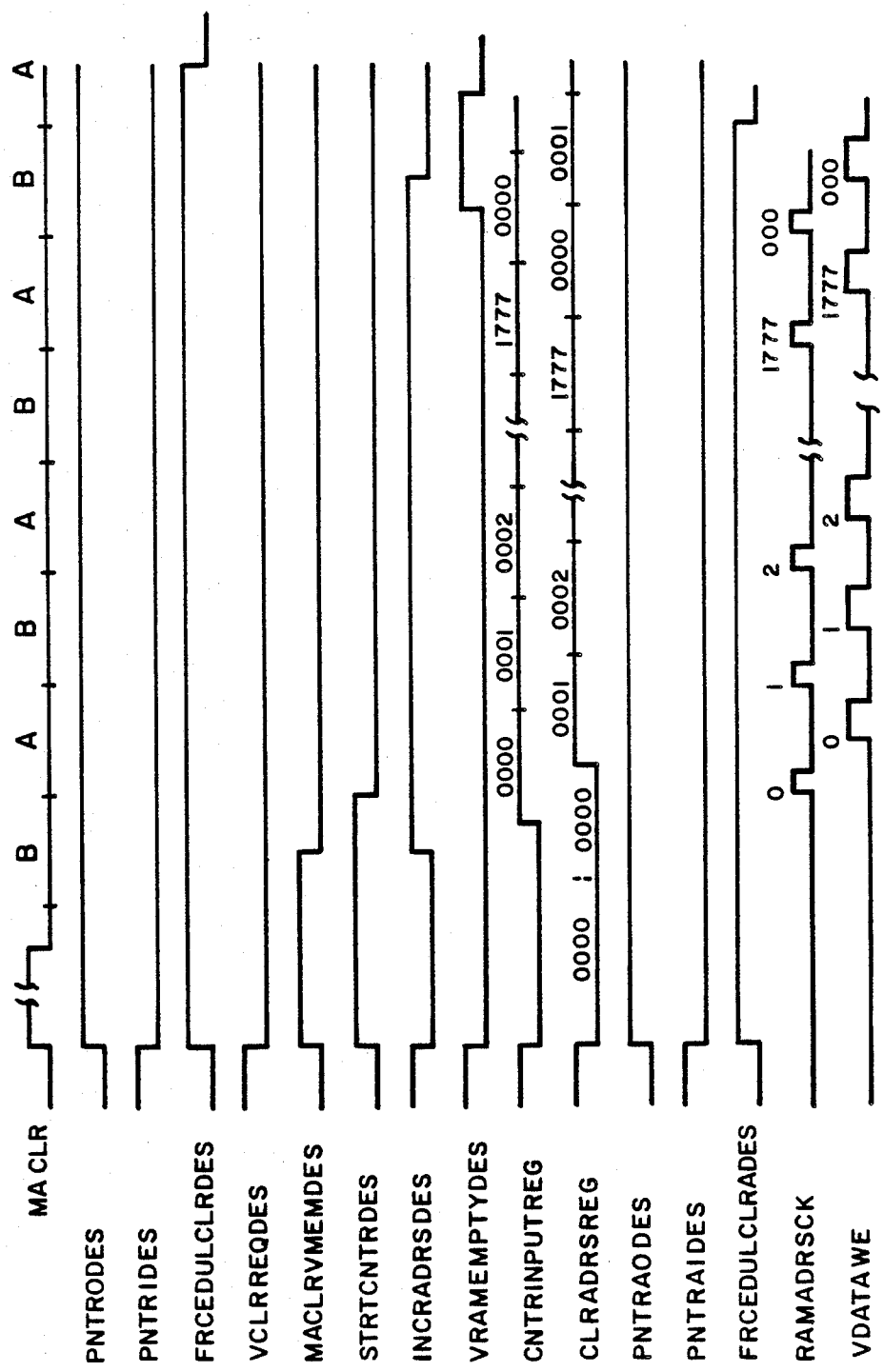
FIGS. 5 and 6 show timing diagrams for the system of FIGS. 2-4.
Figure 6:
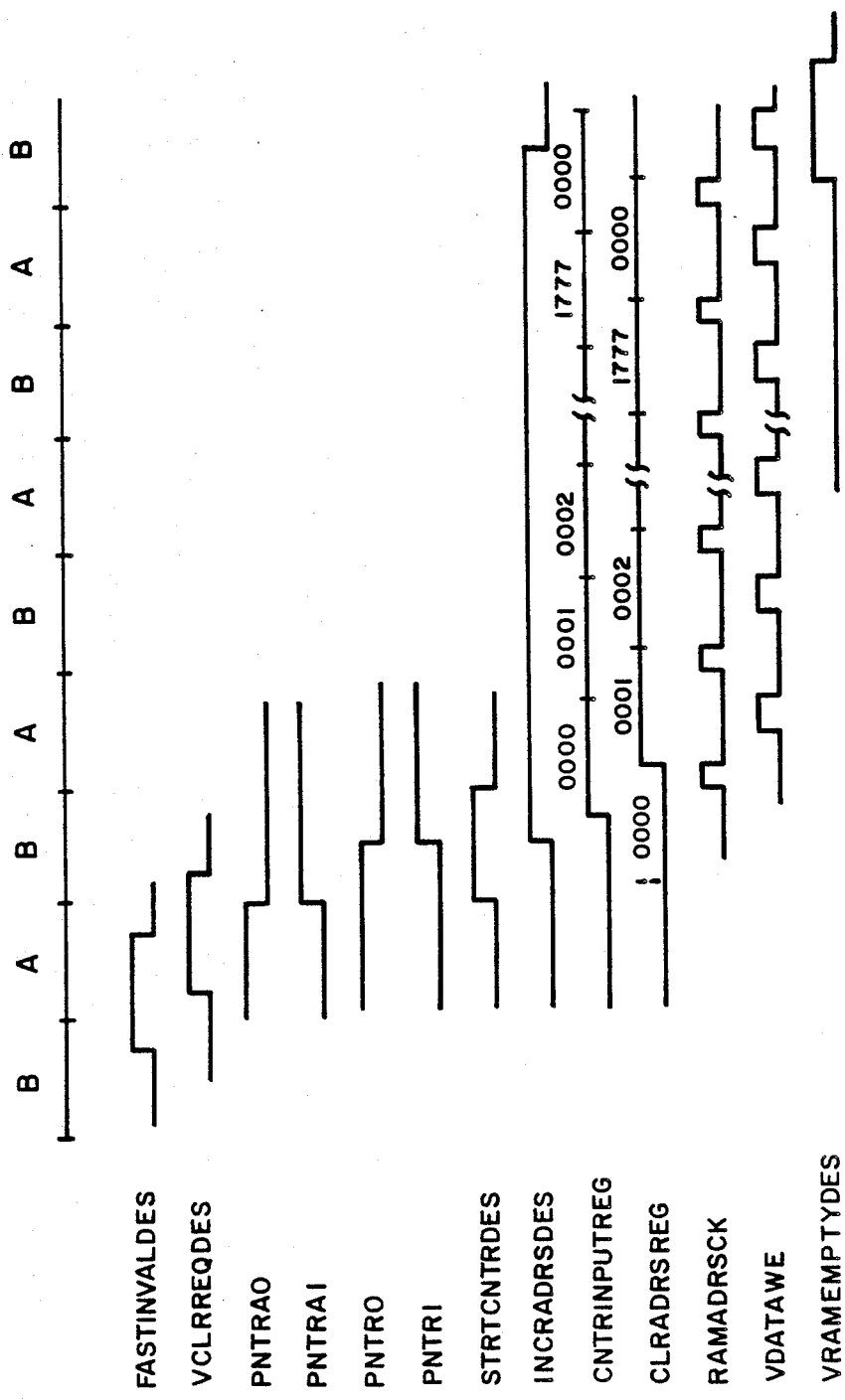

FIGS. 2 and 4 show a specific implementation of the present invention which illustrates the monitor section and one set of RAM A and RAM B validity cache buffers. FIGS. 5-6 are the timing diagram associated with FIGS. 2-4. The following list identifies the full names of the signals and elements of FIGS. 2-4 which are labelled with abbreviations of these names. The abbreviations are employed rather than the full names in the following description and the drawings.

| Abbreviation | Name |
|---|---|
| PNTRA0 | Pointer A0 |
| PNTR0 | Pointer 0 |
| PNTRA1 | Pointer A1 |
| PNTR1 | Pointer 1 |
| VCLR REQ | Validity Clear Request |
| INCRADRS | Increment Addresses |
| VRAMEMPTY | Validity RAM Empty |
| MACLR | Master Clear |
| PH 3B | Phase 3B (CLOCK) |
| PH 4B | Phase 4B (CLOCK) |
| PH 1A | Phase 1A (CLOCK) |
| CLR ADRS REG | Clear Address Register |
| CNTR INPUT | Counter Input |
| MACLR VMEM | Master Clear Validity Memory |

-continued

| Abbreviation | Name |
|---|---|
| FRCEDULCLRA | Force Duplicate Clear A |
| FRCEDULCLR | Force Duplicate Clear |
| TK1 | Timing Pulse 1 |
| TK2 | Timing Pulse 2 |
| VWE | Validity Write Enable |
| STRT CNTR | Start Counter |
| FAST INVAL | Fast Invalidate |

The present invention replaces the use of register file large scale integrated (LSI) circuits with two or more RAM's to store validity bits in cache multiprocessor systems. In modern multiprocessor large scale computers, the size of the required buffers have increased rapidly. For example, in one illustrative machine there are 4 tag memories, 2 for operands and 2 for instructions. This requires 16 register file LSI's per tag memory, or 64 register file LSI's. A maximum number of LSI locations on a card for this machine is 72. The card that contains operand validity bits has 55 LSI's and the card that contains the instructions buffer validity bits has 66 LSI's. It is seen, therefore, that it is impossible to add 32 register file LSI's to each card. Instead, the present invention involves the use of one RAM module with two RAM chips to replace 16 LSI's and to improve the timing control by eliminating one LSI crossing and all of the card foil that is needed to route 16 LSI's. However, since RAM chips do not have a clear line as do registers, a special clearing mechanism must be provided to clear one RAM when the other has been switched-in to replace the prior RAM.

Functional Description

FIGS. 2-4 show logic required for fast invalidation of the Buffer contents. FIG. 5 shows timing for clearing both RAM chips after Master Clear, and FIG. 6 shows timing for fast invalidation (switching from one RAM chip to another and clearing the first RAM chip).

Referring to FIG. 2, MA CLR sets PNTRA0, PNTR0, FRCEDULCLRA, FRCEDULCLR, MACLRVMEM and STRTCNTR designators and clears PNTRA1, PNTR1, VCLRREQ, INCRADRS and VRAMEMPTY designators. Also, MA CLR clears CNTRINPUT and CLRADRS registers. After the clock starts, on PH3B INCRADRS DES is set, on PH4B CNTRINPUT REG receives zeros. Since "OR" gates outputs PNTR0 and PNTR1 are both active, the "AND" gates for the CLRADRS(0-9)-P INPUTS (FIG. 4) are enabled and on PH1A contents of CLRADRS REG are transferred to copy 0 and copy 1 RAM chips internal address registers. The INCRADRS DES input into the CLR ADRS CNTR adds one to contents of CNTRINPUT REG and the output from CLR ADRS CNTR is then gated into the CLRADRS REG on PH2A. Data inputs into RAM chips Copy 0 and Copy 1 are forced to zeros by signals PNTR0 and PNTR1, therefore, on PH3A address locations 0000 in both copies are cleared. On PH1B -0001 is transferred from CLRADRS REG to Copy 0 and Copy 1 internal address registers and, on PH3B address locations -0001 in both copies are cleared. This is repeated every cycle (15 nsec) until address locations 1777 are cleared. Now as one is added to 1777, the most significant bit in the CLR ADRS CNTR becomes active and on PH2B VRAMEMPTY DES is set (see FIGS. 4 and 5). Address location 0000 in both copies is cleared again (which is a don't care). The VRAMEMPTY DES forces INCRADRS DES on PH3B and FRCEDULC-LRA DES on PH1A to clear. On PH3A FRCEDULCLR DES is cleared. Now both RAM chips (Copy 0 and Copy 1) are cleared and ready to be used as Validity Bits.

Since the PNTR0 DES is set, Copy 0 RAM chip is used first for the Validity Bits. As shown in FIG. 3, PNTR0 signal forces zeros from Copy 1. Data "AND" gates and selects CLRADRS "AND" gates which are gating all zeros. Now, even though TK1 or TK3 and VWE become active, this will repeatedly clear address location zero, which is a don't care. On the other hand, since PNTR1 is inactive, this enables EN0-3, DATA 0-3 and WRADRS "AND" gates, which are used during normal operation, and disables CLRADRS "AND" gates.

Now, if fast invalidation is required (as for example, when an invalidate address parity error has been generated and the contents of the cache memory cannot be trusted), the FASTINVAL DES is set on PH4B (see FIG. 2 and 6). On PH2A VCLRREQ DES is set. On the following PH1 PNTRA0 DES is cleared and PNTRA1 DES and STRTCNTR DES are set. On PH3 PNTR0 DES is cleared and PNTR1 is set, this switches the operation from RAM chip Copy 0 to RAM chip Copy 1 and enables RAM chip Copy 0 to be cleared. Also, on PH3 the INCRADRS DES is set, this prevents VCLRREQ DES from setting again and starts the clearing mechanism. The clearing operation works the same as described above, except this time only Copy 0 is being cleared.

What is claimed is:

1. Storage means for storing validity bits in a multi-processor cache memory comprising a plurality of random access storage means, switch means for initially enabling a first one of said plurality of random access storage means thereby enabling it to function as an active store of said validity bits in an operating cache memory, and for disabling the others of said plurality of random access storage means from functioning as an active store of said validity bits for said operating cache memory, said switch means also being operable to disable said first one of said random access storage means and to enable one other of said plurality of said random access storage means for function as an active store of said validity bits upon receipt of an invalidate signal by said cache memory means, and write means for writing into memory locations of said first one of said random access storage means following the disablement of said first one of said random access storage means by said switch means until all of said memory locations are at a common logic level.

2. A validity bit storage means as claimed in claim 1 comprising clear means for initially writing a common logic level into all of the memory locations of all of said plurality of random access storage means.

* * * * *

UNITED STATES PATENT AND TRADEMARK OFFICE
CERTIFICATE OF CORRECTION

PATENT NO. : 4,930,106
DATED : May 29, 1990
INVENTOR(S) : Michael Danilenko, Clarence W. Dekarske, John E. Larson It is certified that error appears in the above-identified patent and that said Letters Patent is hereby corrected as shown below:

Column 6, line 16, delete "for" and substitute -- to -- .

Signed and Sealed this

Ninth Day of July, 1991

Attest:

HARRY F. MANBECK, JR.

*Attesting Officer*     *Commissioner of Patents and Trademarks*